(12) United States Patent
Tseng et al.

(10) Patent No.: US 11,209,697 B1
(45) Date of Patent: Dec. 28, 2021

(54) BACKLIGHT UNIT WITH PHOSPHORS AND QUANTUM DOTS

(71) Applicant: Unique Materials Co., Ltd., Taipei (TW)

(72) Inventors: Huan-Wei Tseng, Taipei (TW); Chun-Wei Chou, Taipei (TW); Chia-Yi Tsai, Taipei (TW); Chia-Chun Liao, Taipei (TW); Shih-Yao Lin, Taipei (TW); Hsueh-Jen Chang, Taipei (TW); Li-Sheng Kao, Taipei (TW)

(73) Assignee: Unique Materials Co., Ltd., Taipei (TW)

( * ) Notice: Subject to any disclaimer, the term of this patent is extended or adjusted under 35 U.S.C. 154(b) by 0 days.

(21) Appl. No.: 17/106,196

(22) Filed: Nov. 30, 2020

(51) Int. Cl.
| | |
|---|---|
| *G02F 1/1333* | (2006.01) |
| *G02F 1/13357* | (2006.01) |
| *F21V 8/00* | (2006.01) |
| *G02F 1/1335* | (2006.01) |
| *H01L 33/50* | (2010.01) |
| *C09K 11/61* | (2006.01) |
| *C01F 17/34* | (2020.01) |
| *C01B 33/10* | (2006.01) |
| *C09K 11/77* | (2006.01) |

(52) U.S. Cl.
CPC ...... *G02F 1/133609* (2013.01); *C01B 33/103* (2013.01); *C01F 17/34* (2020.01); *C09K 11/617* (2013.01); *C09K 11/7774* (2013.01); *G02B 6/0035* (2013.01); *G02F 1/133603* (2013.01); *G02F 1/133614* (2021.01); *H01L 33/504* (2013.01); *C01P 2002/52* (2013.01); *G02F 1/133605* (2013.01)

(58) Field of Classification Search
CPC ......... G02F 1/133609; G02F 1/133614; H01L 33/504; C09K 11/617; C09K 11/7774
USPC ....................................................... 362/97.3
See application file for complete search history.

(56) References Cited

U.S. PATENT DOCUMENTS

| | | | | |
|---|---|---|---|---|
| 2012/0018764 | A1* | 1/2012 | Choi ..................... | H01L 33/382 257/99 |
| 2012/0113672 | A1* | 5/2012 | Dubrow ............... | G02B 6/0073 362/602 |

(Continued)

FOREIGN PATENT DOCUMENTS

| | | |
|---|---|---|
| CN | 105093671 | 11/2015 |
| CN | 105278157 | 1/2016 |
| CN | 210488188 | 5/2020 |

(Continued)

OTHER PUBLICATIONS

"Office Action of Taiwan Counterpart Application", dated May 18, 2021, p. 1-p. 11.

*Primary Examiner* — Christopher M Raabe
(74) *Attorney, Agent, or Firm* — JCIPRNET

(57) ABSTRACT

Provided is a backlight unit including a light source, an encapsulation layer, and a green quantum dot film. The light source emits a blue light. The encapsulation layer encapsulates the light source. The encapsulation layer includes red phosphors and yellow phosphors. The green quantum dot film is disposed above the light source and the encapsulation layer. The blue light is transmitted through the encapsulation layer and the green quantum dot film to generate a white light. A display device including the said backlight unit is also provided.

12 Claims, 3 Drawing Sheets

(56) References Cited

U.S. PATENT DOCUMENTS

2015/0323728 A1* 11/2015 Lee .................. G02F 1/133615
362/97.1
2017/0209842 A1* 7/2017 Kim ........................ B01F 7/021

FOREIGN PATENT DOCUMENTS

| TW | 201643237 | 12/2016 |
| TW | 202036936 | 10/2020 |
| WO | 2020007133 | 1/2020 |

* cited by examiner

BACKLIGHT UNIT WITH PHOSPHORS AND QUANTUM DOTS

BACKGROUND OF THE INVENTION

Field of the Invention

The present invention relates to a backlight unit, and in particular to a backlight unit with phosphors and quantum dots.

Description of Related Art

Currently, most of the backlight units used in flat panel displays use blue light-emitting diode (LED) chips with yellow phosphors to generate a white light backlight. However, the display adopting this kind of white light as backlight cannot achieve wide color gamut. This is mainly due to the low color purity of the green and red lights. Technically, the full width at half maximum (FWHM) of the green (or red) light spectrum is too large. Therefore, it is an important issue to improve the traditional backlight units to make the displays to achieve wider color gamut.

SUMMARY OF THE INVENTION

The invention provides a backlight unit with phosphors and quantum dots which can achieve a wider color gamut to improve the display quality of the display device.

The invention provides a backlight unit including a light source, an encapsulation layer, and a green quantum dot film. The light source emits a blue light. The encapsulation layer encapsulates the light source. The encapsulation layer includes red phosphors and yellow phosphors. The green quantum dot film is disposed above the light source and the encapsulation layer. The blue light is transmitted through the encapsulation layer and the green quantum dot film to generate a white light.

In one embodiment of the invention, the backlight unit further includes a light guide plate disposed between the light source and the green quantum dot film; and a reflective layer disposed on a back surface of the light guide plate to reflect the blue light emitted from the light sources into the green quantum dot film.

In one embodiment of the invention, the yellow phosphors are $Y_3Al_5O_{12}:Ce^{3+}$ (YAG).

In one embodiment of the invention, the red phosphors are $K_2SiF_6:Mn^{4+}$ (KSF).

In one embodiment of the invention, the green quantum dot film includes or does not include a substrate sheet.

In one embodiment of the invention, the green quantum dot film includes a green quantum dot layer.

In one embodiment of the invention, the substrate sheet is disposed above, below, or both above and below the green quantum dot layer.

In one embodiment of the invention, the substrate sheet includes or does not include a gas barrier layer therein.

In one embodiment of the invention, the green quantum dot layer includes a resin material and a plurality of green quantum dots are dispersed and embedded in the resin material, wherein the resin material includes acrylate resin, epoxy resin, or silicone.

In one embodiment of the invention, each green quantum dot in the green quantum dot layer has a core, a core-shell, a core-multi shell, a core-alloy layer-shell, a core-alloy layer-multi shell, or a combination thereof.

In one embodiment of the invention, each green quantum dot in the green quantum dot layer includes a core, and a material of the core is at least one selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe and alloys thereof.

In one embodiment of the invention, each green quantum dot in the green quantum dot layer includes a shell, and a material of the shell is at least one selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe and alloys thereof.

The invention provides a display device including the said backlight unit.

In one embodiment of the invention, the display device further includes a display panel disposed at one side of the backlight unit.

Based on the above, the backlight unit of the present invention with the blue light source encapsulated by the encapsulation layer containing the red phosphors and the yellow phosphors, when used in combination with the green quantum dot film, can complement the lack of color gamut in the display device using yellow phosphors only. Thereby enhancing the color gamut and the display quality of the display device containing the backlight unit of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
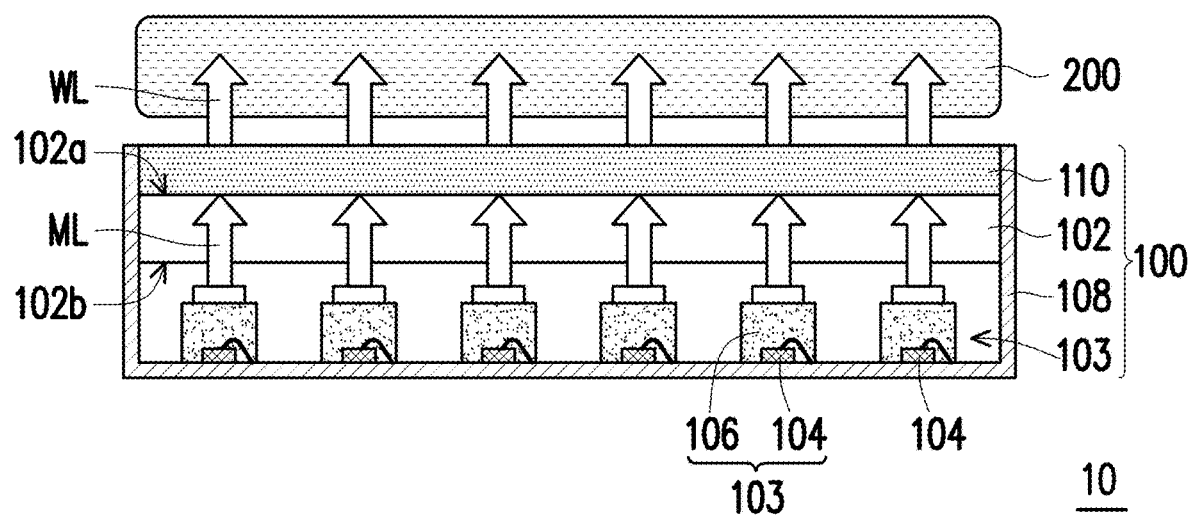
FIG. 1 is a schematic cross-sectional view of a display device according to an embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numerals represent the same or similar components, and are not repeated in the following paragraphs.

Figure 2:
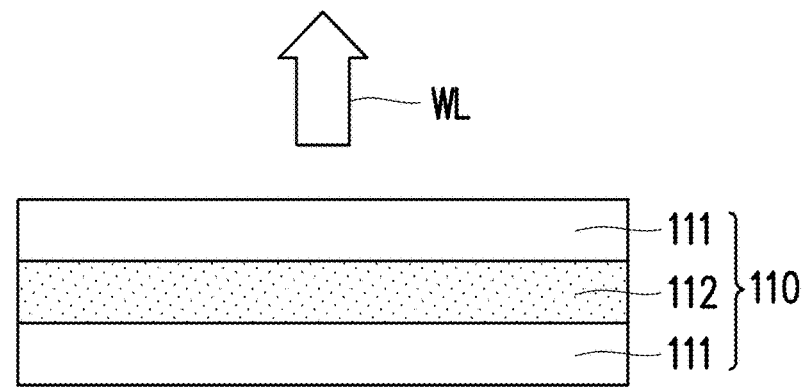
FIG. 2 is a schematic cross-sectional view of a backlight unit according to another embodiment of the invention.
Figure 2:
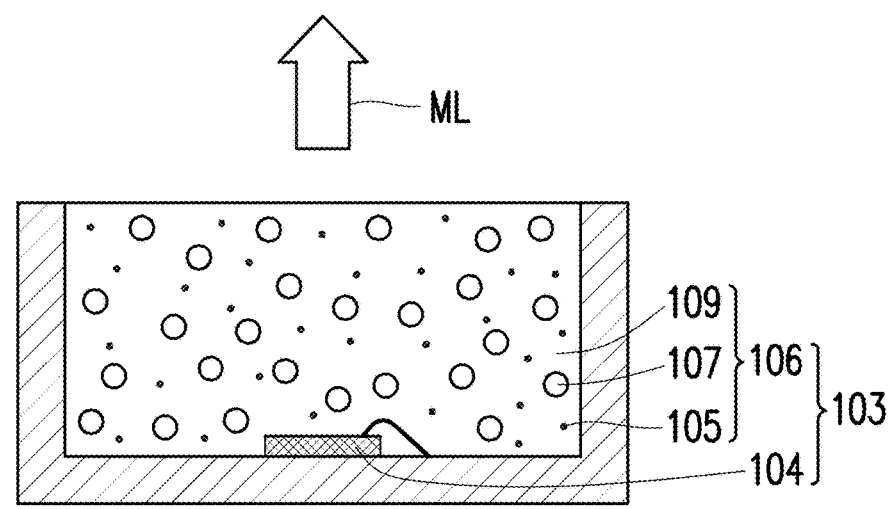

FIG. 1 is a schematic cross-sectional view of a display device according to an embodiment of the invention. FIG. 2 is a schematic cross-sectional view of a backlight unit according to another embodiment of the invention.

Referring to FIG. 1, in an embodiment of the present invention, a display device 10 includes a backlight unit 100 and a display panel 200. The backlight unit 100 is disposed at one side of the display panel 200 (e.g., the underside of the display panel 200). In some embodiments, the display panel 200 may be, but is not limited to, a liquid crystal display panel. The composition and the configuration of the said liquid crystal display panel are well known to those of ordinary skill in the field of optics and will not be described in detail herein.

In some embodiments, the backlight unit 100 includes a light guide plate 102, a plurality of light source packages 103, a green quantum dot film 110, and a reflective layer 108. The light guide plate 102 has a light-exiting surface 102a and a light-entering surface 102b positioned opposite to each other. In the present embodiment, as shown in FIG. 1, the light guide plate 102 has a rectangular shape in cross-section. In alternative embodiments, the light guide plate 102 may also have a triangular shape, a trapezoidal shape or other suitable shapes in cross-section. In an embodiment, the medium of the light guide plate 102 may include transparent plastic, glass or a material capable of guiding light. In alternative embodiments, the light guide plate 102 may be poly(methyl methacrylate) (PMMA), polycarbonate (PC), polyethylene terephthalate (PET), polyimide (PI) or other suitable materials. In other embodiments, the light guide plate 102 has a uniform haze or has a haze that gradually increases along a direction from the light-entering surface 102b to the light-exiting surface 102a. Herein, the "haze" refers to a percentage of light that deviates from the incident beam by greater than 2.5 degrees when passing through a transparent medium, and can be used for the evaluation of a light scattering state of a transparent medium. That is, the higher the haze of the transparent medium, the lower the gloss and the transparency (or distinctness of image) thereof. In contrast, the lower the haze of the transparent medium, the higher the gloss and the transparency (or distinctness of image) thereof.

As shown in FIG. 1, the light source packages 103 are disposed at the light-entering surface 102b of the light guide plate 102 to form a direct-lit structure. In another embodiment, the light source packages 103 may also be disposed on the side surface of the light guide plate 102 to form an edge-lit structure. In an embodiment, the light source packages 103 may be light emitting diode packages (LED packages), or other suitable light emitting device packages. For example, the light source packages 103 are blue LED packages.

One of the light source packages 103 includes a light source 104 and an encapsulation layer 106. The encapsulation layer 106 may encapsulate the light source 104. In one embodiment, as shown in FIG. 2, the encapsulation layer 106 may encapsulate a single light source 104 (e.g., an LED chip disposed in a cavity). Specifically, the encapsulation layer 106 may include red phosphors 105, yellow phosphors 107, and an encapsulant 109. The red phosphors 105 and the yellow phosphors 107 are mixed uniformly in the encapsulant 109 in ratio. In some embodiments, the red phosphors 105 may be a phosphor material with a peak emission wavelength of 590 nm to 680 nm, for example, but not limited to $K_2SiF_6:Mn^{4+}$ (KSF), $CaAlSiN_3:Eu^{2+}$, $YVO_4:Eu^{3+}$, $LiEuW_2O_8$, $Y_2O_2S:Eu^{3+}$, or a combination thereof. The yellow phosphors 107 may be a phosphor material with a peak emission wavelength of 530 nm to 580 nm, for example, but not limited to $Y_3Al_5O_{12}:Ce^{3+}$ (YAG).

As shown in FIG. 2, the blue light emitted by the light source 104 is transmitted through the encapsulation layer 106 to form a mixed light ML with a mixture of the blue, red and yellow light. The mixed light ML is transmitted through the light guide plate 102 (FIG. 1) to reach the green quantum dot film 110. The blue light of the mixed light ML is then partially converted into a green light by the green quantum dot film 110, so that the mixed light ML and the green light are mixed to form a white light WL, which is then transmitted to the display panel 200 on top of the green quantum dot film 110 (FIG. 1).

It should be noted that, in the present embodiment, the encapsulation layer 106 containing the red phosphors 105 and the yellow phosphors 107 may be used to encapsulate the blue light source 104 and, when used in combination with the green quantum dot film 110, can generate the white light WL. In this case, the narrower full width at half maximum (FWHM) of the red phosphors 105 and the green quantum dot film 110 can effectively complement the deficiency of the color gamut in the traditional backlight unit using a combination of the blue LED and the yellow phosphors. This can increase the color gamut of the display device 10, thereby improving the display quality.

Referring back to FIG. 1, the reflective layer 108 is disposed on the back surface 102b of the light guide plate 102 to reflect the mixed light ML, which is emitted by the light source 104 through the encapsulation layer 106, to the green quantum dot film 110. This can improve the usage of the mixed light ML, thereby enhancing the luminous efficacy of the backlight unit 100. In one embodiment, a material of the reflective layer 108 includes a reflective metallic material, such as gold, silver, aluminum, copper or other suitable metallic material.

The green quantum dot film 110 may be disposed on the light-emitting surface 102a of the light guide plate 102. Specifically, the green quantum dot film 110 may include a green quantum dot layer 112. The green quantum dot layer 112 may include a plurality of green quantum dots dispersed and embedded in a resin material. In one embodiment, as shown in FIG. 2, the green quantum dot film 110 includes two substrate sheets 111 and a green quantum dot layer 112 sandwiched between the two substrate sheets 111. In some embodiments, the substrate sheet 111 may include polyethylene terephthalate (PET), acrylate resin, epoxy resin, silicone and similar materials. In another embodiment, the substrate sheet 111 may be an optical film with other optical properties, such as a brightness enhancement film, a polarizing film, a light scattering film, a light diffuser film, and the like. In alternative embodiments, the substrate sheet 111 may include a gas barrier layer (e.g., a diamond-like carbon thin film, a silicon oxide layer, a titanium oxide layer, an aluminum oxide layer, a silicon nitride layer, or the like) therein, so as to effectively block the external environmental factors such as moisture, oxygen, volatile substances and the like. In other embodiments, the substrate sheet 111 may also not include a gas barrier layer therein. Although the green quantum dot film 110 illustrated in FIG. 2 includes two substrate sheets 111, the present invention is not limited thereto. In other embodiments, the green quantum dot film 110 may also include a single substrate sheet 111 disposed either above or below the green quantum dot film 110. Further, the green quantum dot film 110 may not include any substrate sheet 111. In other words, the green quantum dot layer 112 may directly contact the light-exiting surface 102a of the light guide plate 102.

In addition, the backlight unit 100 of the present embodiment may also include other optical films, such as brightness enhancement film, polarizing film, light scattering film, light diffuser film, and the like. The optical films may be optionally disposed above, below, or both above and below the green quantum dot film 110.

Figure 3:
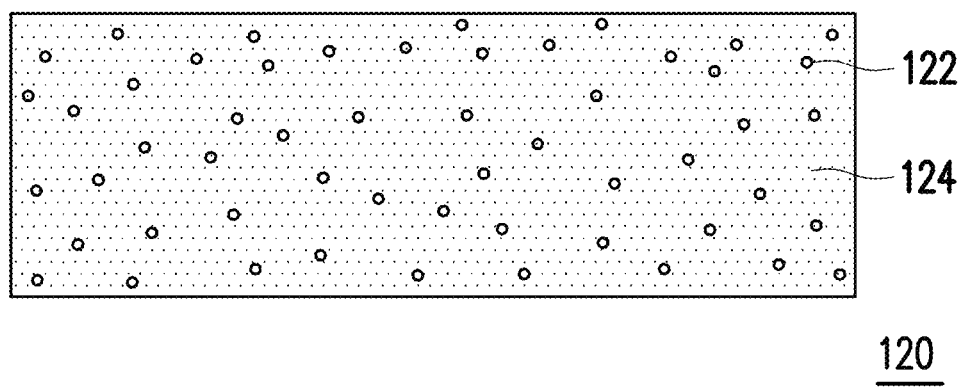
FIG. 3 is an enlarged schematic view of a quantum dot layer according to an embodiment of the invention.

FIG. 3 is an enlarged schematic view of a quantum dot layer according to an embodiment of the invention. In the following embodiments, the quantum dot layer 120 shown in FIG. 3 may be, but is not limited to, the green quantum dot layer 112 shown in FIG. 2.

Specifically, as shown in FIG. 3, the quantum dot layer 120 includes a luminescent material 122 dispersed and embedded in a resin material 124. In one embodiment, a content of the luminescent material 122 is 0.01 wt % to 15 wt %. In the present embodiment, the luminescent material 122 includes a plurality of quantum dots. The quantum dot includes a core, a core-shell, a core-multi shell, a core-alloy layer-shell, a core-alloy layer-multi shell, or a combination thereof. Particle size or dimension of the quantum dots may be adjusted according to the required specifications (e.g., to emit visible lights of different colors), and the invention is not limited thereto.

In one embodiment, the said "core" may be, for example, at least one selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe and alloys thereof. In one embodiment, the said "shell" is, for example, at least one selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TlAs, TlSb, PbS, PbSe, PbTe and alloys thereof. The said core or the said shell may be selected according to different specifications, and the invention is not limited thereto.

In one embodiment, a content of the resin material 124 is 85 wt % to 99.99 wt %. In some embodiments, the resin material 124 may be acrylic resin, epoxy resin, silicone, or a combination thereof. Specifically, the resin material 124 is prepared from a precursor. The precursor includes: 30 wt % to 50 wt % of a first acrylate monomer, 15 wt % to 30 wt % of a second acrylate monomer, 5 wt % to 30 wt % of a surfactant having a thiol group, 5 wt % to 20 wt % of a cross-linker, and 1 wt % to 2 wt % of an initiator. In alternative embodiments, a content of the surfactant is less than a content of the first acrylate monomer. In some embodiments, the quantum dot layer 120 may include the precursors made of the same material or different materials. In other embodiments, the quantum dot layer 120 may include the luminescent material 122 and the resin material 124 with the same content or different contents.

Experiment examples of the invention are mentioned below to describe the invention more specifically. However, the materials, methods used and the like as shown in the following experiment examples may be suitably modified without departing from the spirit of the invention. Therefore, the scope of the invention should not be interpreted in a limiting sense using the experiment examples shown below.

Comparative Example 1

Figure 4:
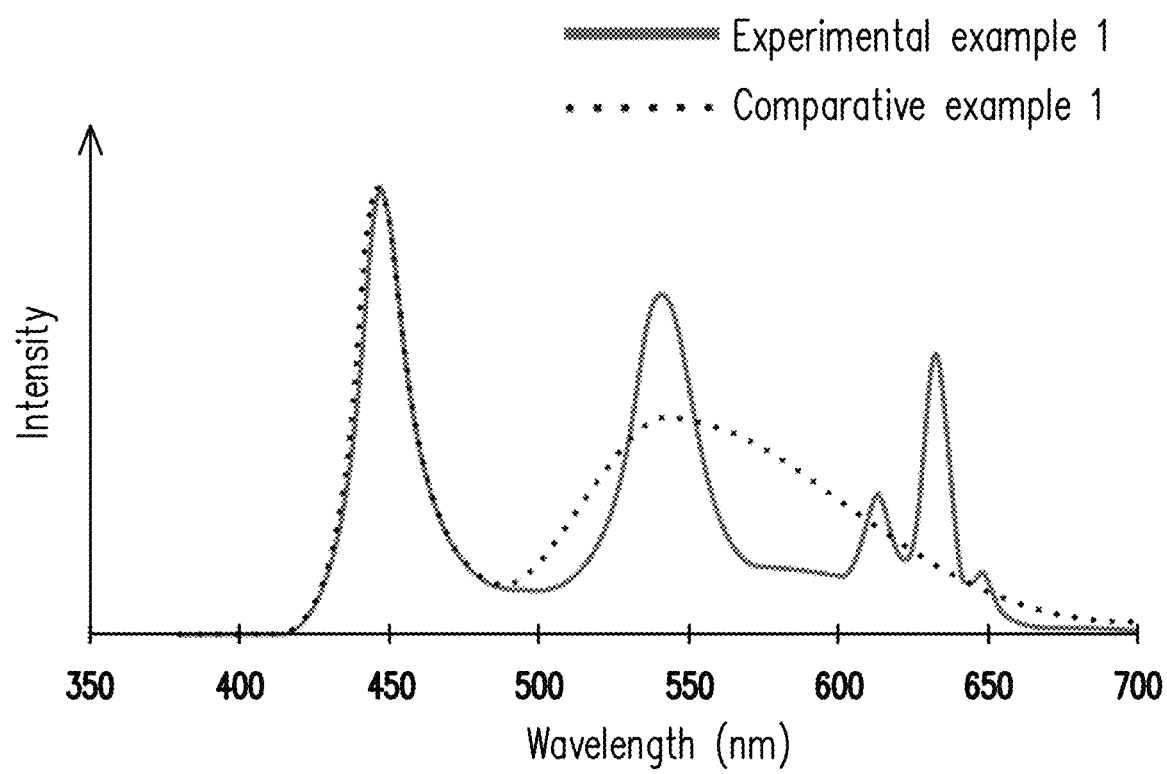
FIG. 4 is a graph showing the relationship between the luminous intensity and the wavelength of the backlight units of Experimental Example 1 and Comparative Example 1.
Figure 5:
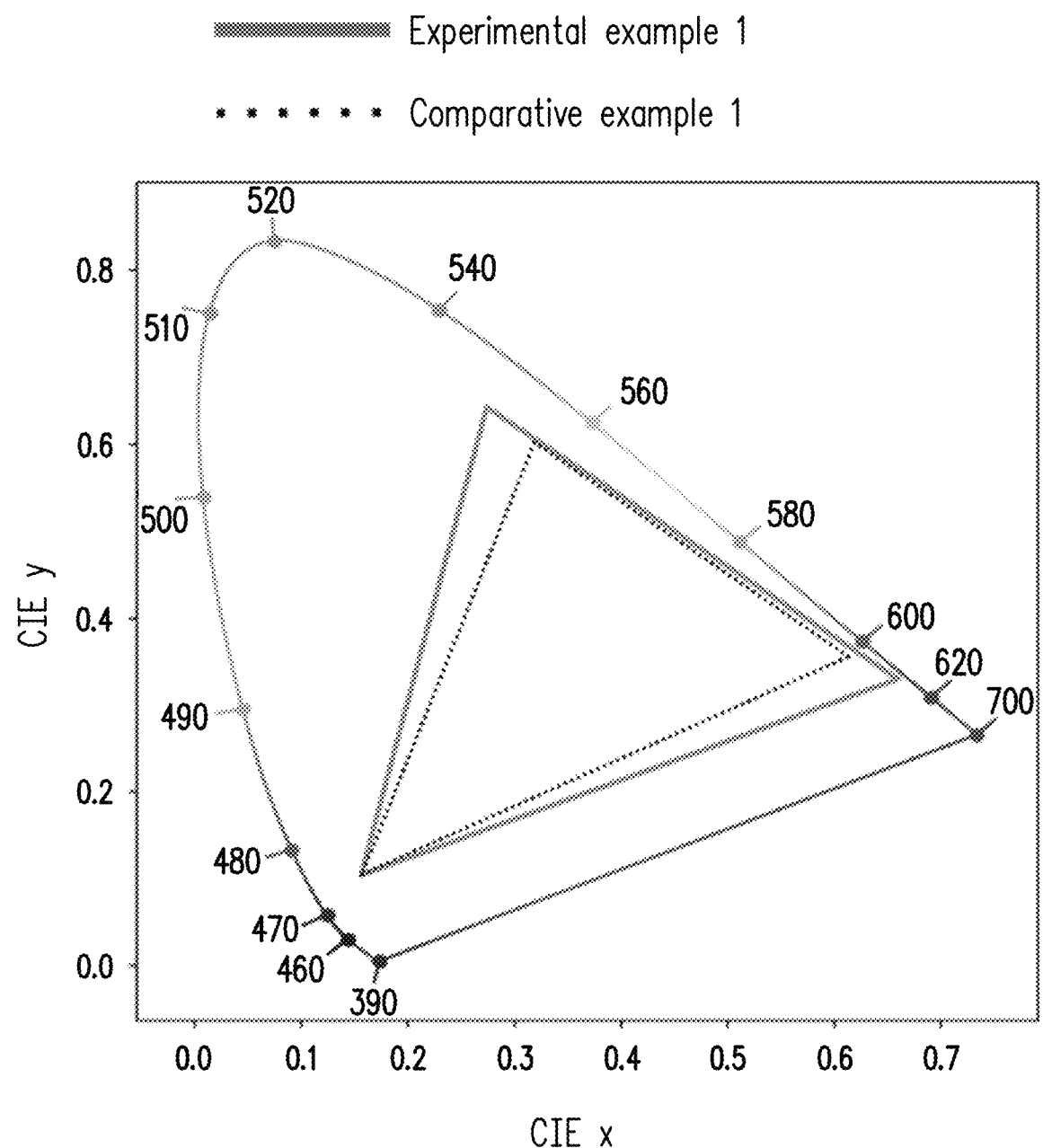
FIG. 5 is a chromaticity diagram of the displays of Experimental Example 1 and Comparative Example 1.

The yellow phosphors (YAG) and the encapsulant (OE-6370 HF, purchased from Dow Corning®) are mixed and then used to encapsulate the blue LED chip, so as to form a LED package. Thereafter, the LED package is used in the light bar of the backlight unit to be assembled as the backlight unit, and the light emitted is measured using a luminometer. The result is shown in FIG. 4. The said backlight unit is then assembled into a display and the color gamut of the display is measured. The result is shown in FIG. 5.

Experiment Example 1

First, the green quantum dots and acrylic resin are mixed and sandwiched between two substrate sheets, and then cured by UV, to form a green quantum dot film. Thereafter, the red phosphors (KSF), the yellow phosphors (YAG) and the encapsulant (OE-6370 HF, purchased from Dow Corning®) are mixed and then used to encapsulate the blue LED chip to form a LED package. Afterwards, the LED package and the said green quantum dot film are assembled in the configuration as shown by the backlight unit 100 of FIG. 1. The light emitted is measured using a luminometer. The result is shown in FIG. 4. The said backlight unit is then assembled into a display and the color gamut of the display is measured. The result is shown in FIG. 5.

Referring to FIG. 4, since the red phosphors (KSF) and the green quantum dot films of Experimental Example 1 have a narrower FWHM. This can effectively complement the deficiency of the color gamut as shown by Comparative Example 1 which only uses the yellow phosphors, thereby effectively complement the lack in color gamut. In addition, as shown in FIG. 5, compared with Comparative Example 1, the display of Experimental Example 1, which includes the red phosphors (KSF), the yellow phosphors (YAG), and the green quantum dot film, can have a wider color gamut, thereby improving the color realism and display quality.

In summary, in the backlight unit of the present invention with the blue light source encapsulated by the encapsulation layer containing the red phosphors and the yellow phosphors, when used in combination with the green quantum dot film, can complement the lack of color gamut in the display device using yellow phosphors only. Thereby enhancing the color gamut and the display quality of the display device with the backlight unit.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A backlight unit, comprising:
   a plurality of light source packages, wherein each light source package comprises:
      a light source emitting a blue light; and
      an encapsulation layer encapsulating the light source, wherein the encapsulation layer comprises red phosphors and yellow phosphors;
   a green quantum dot film disposed above the plurality of light source packages, wherein the blue light is transmitted through the encapsulation layer and the green quantum dot film to generate a white light, wherein the green quantum dot film comprises a substrate sheet having no gas barrier layer therein; and
   a light guide plate disposed between the plurality of light source packages and the green quantum dot film.

2. The backlight unit according to claim 1, further comprising:
   a reflective layer disposed on a back surface of the light guide plate to reflect the blue light emitted from the light sources into the green quantum dot film.

3. The backlight unit according to claim 1, wherein the yellow phosphors are $Y_3Al_5O_{12}:Ce^{3+}$ (YAG).

4. The backlight unit according to claim 1, wherein the red phosphors are $K_2SiF_6:Mn^{4+}$ (KSF).

5. The backlight unit according to claim 1, wherein the green quantum dot film comprises a green quantum dot layer.

6. The backlight unit according to claim 5, wherein the substrate sheet is disposed above, below, or both above and below the green quantum dot layer.

7. The backlight unit according to claim 5, wherein the green quantum dot layer comprises a resin material and a plurality of green quantum dots are dispersed and embedded in the resin material, wherein the resin material comprises acrylate resin, epoxy resin, or silicone.

8. The backlight unit according to claim 5, wherein each green quantum dot in the green quantum dot layer has a core, a core-shell, a core-multi shell, a core-alloy layer-shell, a core-alloy layer-multi shell, or a combination thereof.

9. The backlight unit according to claim 5, wherein each green quantum dot in the green quantum dot layer comprises a core, and a material of the core is at least one selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe and alloys thereof.

10. The backlight unit according to claim 5, wherein each green quantum dot in the green quantum dot layer comprises a shell, and a material of the shell is at least one selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe and alloys thereof.

11. A display device, comprising: the backlight unit according to claim 1.

12. The display device according to claim 11, further comprising a display panel disposed at one side of the backlight unit.

* * * * *